United States Patent [19]
Zingrini et al.

[11] Patent Number: 4,504,107
[45] Date of Patent: Mar. 12, 1985

[54] PITCH VARIATORS FOR SUB-RACK CONNECTORS

[75] Inventors: Carlo Zingrini, Milan; Maurizio Oreglio, Bellinzago Lombardo, both of Italy

[73] Assignee: Telettra-Telefonia Elettronica E Radio S.p.A., Milan, Italy

[21] Appl. No.: 554,166

[22] Filed: Nov. 22, 1983

Related U.S. Application Data

[63] Continuation of Ser. No. 279,937, Jul. 2, 1981, abandoned.

[30] Foreign Application Priority Data

Jul. 16, 1980 [IT]   Italy .............................. 23475 A/80

[51] Int. Cl.³ ......................................... H01R 13/518
[52] U.S. Cl. .............................. 339/125 R; 339/119 R
[58] Field of Search ....................... 339/119 R, 125 R; 361/399, 415; 211/41

[56] References Cited
U.S. PATENT DOCUMENTS

| | | | |
|---|---|---|---|
| 3,017,232 | 1/1962 | Schwab et al. | 211/41 |
| 3,197,731 | 7/1965 | Beale et al. | 211/41 |
| 4,109,294 | 8/1978 | Mason et al. | 361/399 |
| 4,371,083 | 2/1983 | Zingrini et al. | 361/391 |

FOREIGN PATENT DOCUMENTS

| | | | |
|---|---|---|---|
| 2333282 | 1/1975 | Fed. Rep. of Germany | 339/119 |
| 2519117 | 11/1976 | Fed. Rep. of Germany | 361/399 |
| 143495 | 5/1979 | German Democratic Rep. | 361/415 |

Primary Examiner—John McQuade
Attorney, Agent, or Firm—Holman & Stern

[57] ABSTRACT

Pitch variators for connectors of subracks housing telecommunication equipment and fixed to racks are described, which allow shifting of said connectors within a fraction of the shifting of the subracks and which consist of a fixed slotted frame and of a transition piece which can be snap-inserted into the slotted frame in a number of position matching with the ratio between the holes on the upright and the distance of the sliding guides of the units of printed circuit boards in the modular container of the subrack.

17 Claims, 11 Drawing Figures

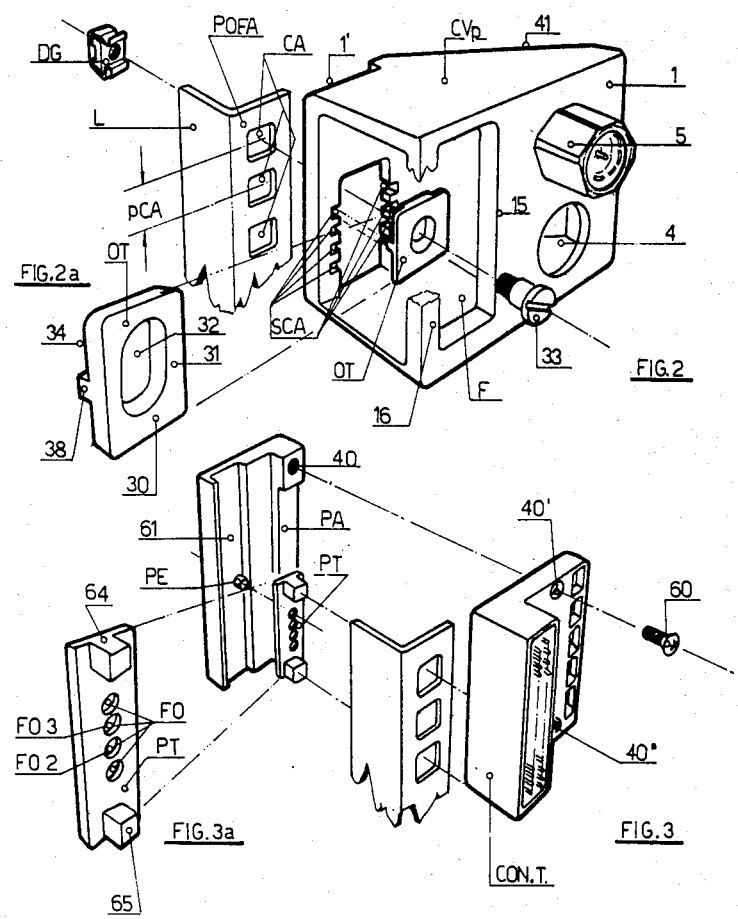

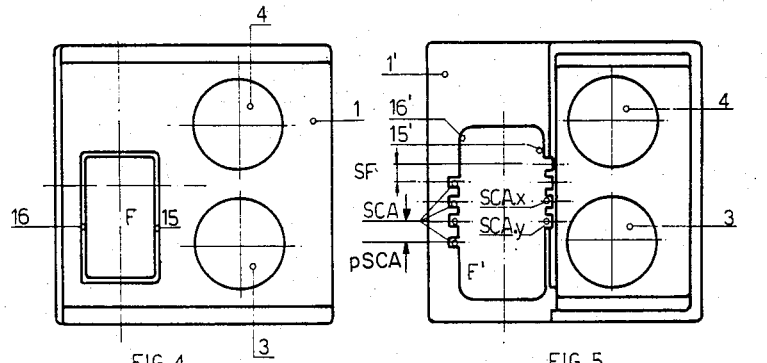
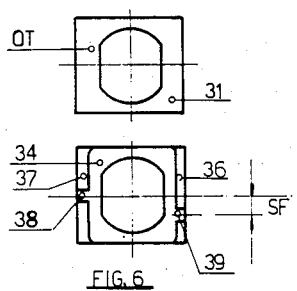
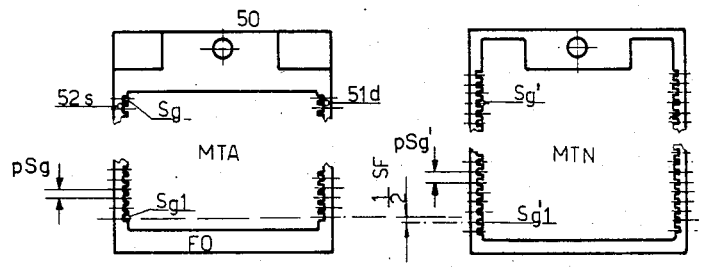

PITCH VARIATORS FOR SUB-RACK CONNECTORS

BACKGROUND OF THE INVENTION

This is a continuation of application Ser. No. 279,937, filed July 2, 1981 and now abandoned.

FIELD OF THE INVENTION

The present invention refers to pitch variators for racks consisting of uprights on which are fixed sub-racks or modules containing units (printed circuit boards) and on which are fixed connectors (generally plug-in) which effect the connections between the various circuit boards of same subrack or of different sub-racks, as well as the connection between the printed boards and the various external circuits.

STATEMENT OF THE PRIOR ART

It is known that the racks for telecommunication consist of a metal support structure which is generally developed vertically with a C or U cutaway section made up of uprights fitted with pins and holes to support the metal shelves on which are secured the sub-racks or modules containing the printed circuit boards.

The inner sides of the uprights are fitted with structures allowing the anchorage of the rack connectors which are generally plugged-into the external connectors of the subrack that are, in turn, plugged into internal connectors.

The rack must be structured to accomodate subracks or modules of different sizes as well as to allow displacements and configurations which are extremely articulated.

A very advanced and universal type of rack is described in Italian application No. 23474A/79, (June 12, 1979).

This rack, which can house a very wide range of sub-racks and modules containing telecommunication equipment, power supply and station cables, connectors, etc., is made up of a vertical steel upright and of a certain number of brackets which have an horizontal suspension base for the subrack modules and two side ribs each featuring a slit, a U-shaped notch and holes into which are snap-inserted the clevis pins of the uprights. Each bracket of the subrack may assume, on the distance between adjacent clevis-pins, a number of positions n corresponding to the number (n) of holes with the distance divided by m. Therefore the subrack modules are secured between successive brackets by combining two-by-two the distance/m positions of each bracket. An ideal distance between pins may, for instance, be 60 mm, the holes on the brackets are 6 (n=6) with a distance between the first and the last hole of 5/6 the distance that is of 50 mm and the space between the holes is $P_{BU} = DI/N = 10$ mm.

The uprights are internally provided with brackets with holes for insertion of fasteners or of caged nuts which secure the connectors to the racks. In the above arrangement the brackets in question are made out of a crop end (L) the orthagonal surfaces of which (POFA) are provided with circular or quadrangular cavities for the insertion of fasteners such as the caged-nuts (DG): in general the distance between the center line of these holes or cavities (PCA) is equal to the distance (PBU) of the bracket shifting (e.g. 10 mm).

For the better understanding of the present invention, reference is made to the aforementioned Italian application the pitch variators for rack connectors according to the present invention are applicable, however, not only to the so called "slim" racks described in said prior patent, but also to any other type of rack with connectors inserted in receiving holes spaced one from the other by a certain distance, independently of the means and distance with which the sub racks and/or related connectors are shifted.

SUMMARY OF THE INVENTION

In fact, owing to its continuous research in the sector, Applicant has ascertained that the displacement or shifting of the rack connectors within a determined distance equal (or greater) to that required for the shifting of the sub-rack modules, created a serious handicap with regard to the optimized use of the subrack modular containers and that the maximum flexibility of the integral use of the racks is obtained not only with the maximum capability of insertion of the modules but also and above all with the maximum shiftability of the connectors.

The first object of the invention is to provide pitch variators which permit the rack connectors to be shifted within the minimum possible distances which are submultiples of the distance between the centerline of the holes. Another purpose of the invention is to provide pitch variators for rack connectors which allow the maximum use of any type of module, whether of the monoblock or of the assembled type. A further object of the invention is to provide pitch variators allowing the rack connectors to be shifted within distances which are submultiples of the distance between the centerline of the holes.

Another purpose of the invention is to provide pitch variators for rack connectors for use with any type of module, whether of the monoblock type or of the assembled type. A further object of the invention is to provide pitch variators which allow the maximum use of any module fully equipped with printed circuit boards. In fact, the invention makes provision for pitch variators that match with the units plugged-into the modules of the container type with a coaxial cable output at a higher position but at a multiple of e.g. 2.5 mm, and/or of the normal type with spot welded connections. These and other objects are attained with the pitch variators, according to the present invention characterized by a suspension body secured to the receiving hole of the upright and of a transition piece with fixing teeth; every shift of this transition piece coincides with the minimum displacement of the circuit units in the module container.

In the first form of realization which applies to the case of circuit units lodged in a container with coaxial cable terminals, the support or suspension body consists of a casing fitted with a grooved opening while the transition piece is made up of a small squared toothed plate which is snapinserted into the grooves of the support or suspension body. In another embodiment for normal circuit units, the pitch variator is made up of two plates, preferably of metal, one of which is larger and is fitted with grooves and a protruding pin, while the second, smaller, plate is fitted with slots.

The various aspects and advantages of the invention will be clearly evidenced in the following detailed description of the embodiments (preferred but not limitative) represented in the drawings attached hereto of which:

BRIEF DESCRIPTION OF THE DRAWING

FIG. 2 is an exploded, perspective view of the pitch variator of the invention for an cased unit;

FIG. 3 is a similar view of the pitch variator of the invention for a normal printed circuit board unit;

FIG. 2a is a detailed perspective view of the pitch variator transition piece of FIG. 2;

FIG. 3a is a detailed perspective view of the pitch variator transistion piece of FIG. 3;

FIG. 4 is a front view of the pitch variator support body of FIG. 2;

FIG. 5 is a front view of the pitch variator support body of FIG. 2 with the side 1 removed;

FIG. 6 is a front and rear view of the pitch variator transition piece of FIG. 2a;

FIG. 7 is a front and rear view of an alternate embodiment of the pitch variator transition piece of FIG. 2a;

FIG. 8 is a rear view of a subrack module container of the assembled type, useful in conjunction with the pitch variator of the invention;

FIG. 9 is a rear view of a subrack module container of the monoblock type, useful in conjunction with the pitch variator of the invention.

DETAILED DESCRIPTION OF THE INVENTION

Figure 1:
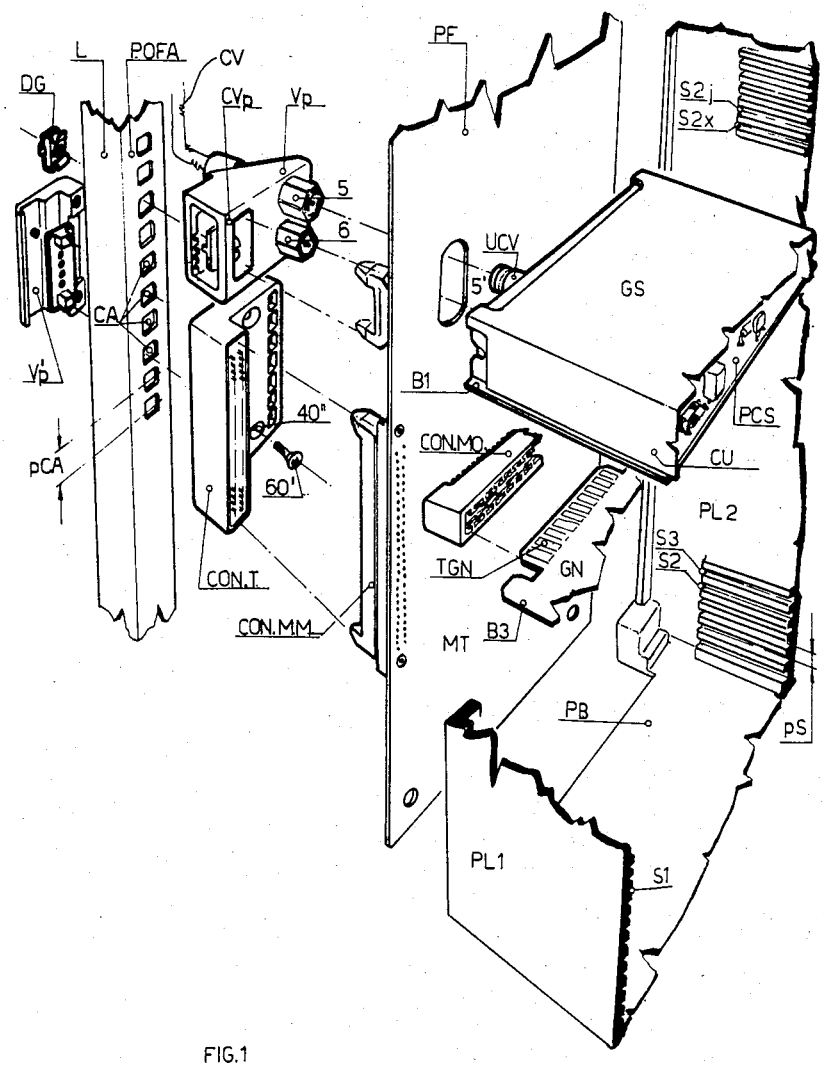
FIG. 1 is an exploded view with all of the components represented.

The references L and POFA, in FIG. 1, indicate (as in the prior Italian patent application referred to a section of the L-shaped sheet-steel (L) with its drilled side POFA; the holes CA on the side POFA can be quandrangular, rectangular or circular. The caged nuts DG are secured into these holes CA while connectors CO are screwed into said cage nuts DG.

As represented and described in the prior patent application referred to above, the distance PCA of the holes CA may coincide with the $P_{BU}$ of the intervals PBU holes BU on the brackets of the subrack. This distance, which is preferably of 10 mm, allows the connectors CO to be shifted in steps of 10 mm.

This arrangement fails to allow for a suitable exploitation of the fill-in capabilities of the modules. The module or modular container of subrack MT (shown in cut out view in FIG. 1, that is, with its side wall PL1 and rear wall PF partially removed and without an upper cover) is fitted with grooves or guides $S_1$ and $S_2$ on each of the two side walls PL1 and PL2 to allow insertion of a certain amount of units (printed circuit boards) which may be of two types: (A) normal units GN (thin printed circuit boards with solderin connections) the terminal male connectors TGN of which are plugged-in to a module connector CON.MO, which is generally horizontally mounted; several units GN, generally up to 50, may be inserted into a modular container; (B) encased units GS with coaxial cable outputs UCV (the other output UCV is not visible in FIG. 1); these units consist of a printed circuit board (PCS) encased in a container CU which is fitted on the rear with two coaxial cable outputs UCV. The encased units GS are slid into the corresponding guides S of PL1 and PL2 via their edges B1 and B2 (the edge B2 is not visible in FIG. 1), whereas the thin printed circuit boards GN are slid into corresponding guides S of PL1 and PL2 via their edges B3 and B4 (B4 is not visible in FIG. 1); since the distance between the center lines of two successive grooves S1–S3 (distance between the grooves: pS) is very small with respect to the distance pCA between the holes CA, and consequently very small displacements (pS) of the boards GS or GN in MT would not coincide with displacements of the rack connectors CON.T which can be displaced (according to the technique adopted and described in the previous application referred to above) only the larger distances PCA. This inconvenience (typical of conventional racks) makes no allowance for a suitable and flexible use of modules MT.

The present invention eliminates this gap by providing pitch variators to be inserted between the modules MT and the holes CA of the upright POFA. The pitch variator $V_p$ represented in FIG. 1 and in FIGS. 2, 4, 5, 6 and 7, substantially consists of a suspension body $CV_p$ having the shape of a quadrangular or rectangular box, preferably beveled on its side 41, as shown in FIG. 2. Its front side 1 (FIG. 4) includes a rectangular slot F with flat edges 15 and 16 and two openings, preferably circular, 3 and 4 for insertion of coaxial connectors 5 and 6 (FIG. 1). The rear side (the front view of which is shown in FIG. 5) also illustrates the two openings 3 and 4, preferably circular, for the coaxial cable CV, a slot F' which is aligned with the slot F but is of larger dimensions, and the side edges 15' and 16' of F'.

According to a remarkable feature of the invention, a transition piece OT is snap-inserted into the grooves SCA in the side edges 15' and 16' of slot F' of suspension body CVp. This transition piece OT (FIGS. 2, 2a, 6 and 7) consists of a small square plate 30 with a front face 31 (FIG. 2a), having an aperture 32 for receiving a fastener 33, and with a rear face 34 slightly smaller on the edges 36 and 37 with respect to the edges of the front 31. The side edges 36 and 37 on the rear 34 are provided with two protruding teeth 38 and 39 sized to be snap-inserted into grooves SCA of suspension body CVp. As detailed by the inserts of FIGS. 6 and 7, the two teeth 38 and 39 are not aligned longitudinally one with the other but present a phase shift SF which depends on the structure of the modular container MT.

As detailed in the insert in FIG. 8 representing a partial view of a modular container MTA, the grooves Sg of the container MTA have a width and a spacing of, for example, 2.5 mm, but the first groove at the bottom, Sgl, is slightly raised with respect to the bottom FO of the container MTA, which is of the assembled type, that is, made up of four assembled, panels, namely a base FO, a cover 50, a left side 51d and a right side 52s. FIG. 9 illustrates a modular container of the monoblock type MTN, that is, of a single piece obtained from casting or pressing in which the grooves or guides Sg' present the same width and the same pitch of 2.5 mm exactly as for the "assembled" connector guides of FIG. 8, but the guides Sg' are shifted towards the bottom by ½SF with respect to the guides Sgl of the assembled type container. The grooves SCA on the edge 16' of the rectangular slot in the suspension body, are not aligned with the grooves $SCA_x$ and $SCA_y$ on edge 15' but are shifted with respect to those by the same offset pitch of the teeth 38–39.

The offset SF between these teeth 38 and 39 of the transition piece OT of FIGS. 6 and 7 depends on the offset between the grooves SCA on the edges 15' and 16' of slot F'. The pitch pSCA of the grooves SCA will normally be equal to the pitch pS of the grooves S in MT.

The suspension body $CV_p$ is preferably made of plastic material, as for instance of acetalic resin, polycarbonate, polyethylene, or polypropylene, while the transition body or chip OT is preferably made of a more rigid plastic material.

According to an advantageous aspect of the invention, the number of grooves SCA on the edges 15' and 16' of the slot F' corresponds to the ratio between the pitch pCA (that is the distance between the holes CA on POFA) and the pitch of the grooves Sg and Sg' in the modules MTA or MTN; for the sake of clarity, if the pitch pCA of the holes CA is of 10 mm and the pitch of the grooves Sg (pSg) in MTA, or of the grooves Sg' (pSg') in MTN is of 2.5 mm, the number of grooves SCA in F' will be typically be 4, as represented in the drawing. Obviously, the number of grooves SCA may differ from the ratio pCA/pSg or pCA/pSg' in the scarcely probable case where the pitch pSg' of the grooves on the assembled module is different from the pitch of the grooves pSg' on the monoblock module MTN.

The function of the pitch variator for an encased unit GS can be easily apprehended; when an encased unit GS (FIG. 1) is displaced from one groove to another in the module MT, for instance, from the groove S3 to a subsequent groove $S_{2j}$, or from $S_2$; to $S_{2x}$, (the displacement is generally made in steps of 2.5 mm), the transition piece OT (in this case the chip with the slot 32 and with the two teeth 38 and 39) will be shifted accordingly, from the groove $SCA_x$ to the successive groove $SCA_y$ (also in step of 2.5 mm). In this way, the coaxial connectors 5' and 6' (not shown) of the PCS encased in GS are followed by a similar displacement of the connectors 5 and 6 on the suspension body CVp of the pitch variator Vp. Without this pitch variator, the encased units GS could be displaced, inside the module MT, only with pitches pS coinciding with the pitch of the holes pCA; for example, the units GS could be displaced only every four grooves. This was detrimental to the fill-in capability of the module MT. On the contrary, with the use of the pitch variator, according to the invention, every minimum displacement of the GS (i.e. equal to the passage from one groove to the other, for instance, from $S2_x$ to $S2_j$) is followed by an identical minimum displacement of the transition piece OT from a groove $SCA_x$ to the successive groove $SCA_y$.

As previously mentioned, the subrack modules MT are mainly equipped with a normal plug-in printed circuit board unit GN, the terminal connectors TGN of which are plugged into the module connector CON.MO. When a normal unit GN is displaced from one groove S3 to a subsequent groove S2, the internal connector CON.MO is similarly displaced (e.g. 2.5 mm) and may require as well the displacement of CON.MM with an equal or multiple distance. Consequently, also the connection with the rack connector CON.T must endure this minimum displacing. In older racks, the connector CON.T could be displayed longways the upright POFA only from one hole CA to another, that is, with a pitch between the holes pCA which, as explained previously, is greater than the pitch of the grooves S2-S3 in the module MT. Consequently, the rack connector CON.T was displaced within a larger pitch pCA (e.g., of 10 mm), thereby reducing considerably the fill-in capability of the subrack modules MT.

The invention also provides a pitch variator V'p which substantially consists, as clearly shown in FIG. 3, of two plates the first of which PA is fitted with a fixed pin PE while the second plate PT (smaller and shorter than the plate PA) is fitted with a number of slots FO which is equal to the number of grooves SCA on the slot F' of OT in FIG. 5 and which have the same pitch of the grooves SCA, which number of holes is determined by the ratio between the pitch of the holes pCA and the pitch pSg or pSg' of the grooves Sg and Sg' in the modules MTA, and MTN. In FIG. 3, the two plates PA and PT are distinctly represented; the larger plate PA represents slots or holes 40 aligned with the slots 40' of the connector CON.T which is thus secured to the plate PA with a fastener such as a screw 60 inserted in holes 40' and 40.

In FIG. 1 is represented a second screw 60' which is to be inserted into the hole 40" of the connector CON.T and tightened into a lower hole 40 of PA (not represented in either FIG. 1 or 3). The larger plate PA, includes a long and continuous groove 61 which forms a seat for the smaller plate PT; PA is the body to be secured to the upright POFA and corresponds therefore, to the suspension body $CV_p$ of FIG. 2, whereas the smaller plate PT with slots FO, corresponds to the transition body OT of FIG. 2a. The plate PT is fitted with two projecting terminals 64 and 65 which are at a distance corresponding to a multiple DI of a hole pitch pCA and are therefore connectible to two successive holes CA in POFA. In the specific case, it is preferred to keep the smaller plate PT steady in the holes and shift the larger plate PA so that when a normal unit GN passes from a groove S2 to the next groove S3 (forcing also CON.MM to be displaced with an equal or multiple pitch), the pin PE on the larger plate PA is simply displaced from a hole $FO_2$ to the next successive hole $FO_3$ to allow the connector CON.T to be shifted within the wanted distance. It is, however, pointed out that the small plate PT is still intended as a transition piece, since with its holes FO presenting a pitch equal to the ratio pCA/pSg it determines the displacement of the rack connector CON.T which coincides with the displacement of the module connector CON.MO, which in turn follows the displacement of the PCB unit GN. Actually, the larger plate PA can be maintained fixed while the smaller plate PT can be displaced. It is, however, preferable to have the smaller plate PT fixed on a position and to move the larger plate PA by shifting the pin PE from a hole FO to the other of PT.

We claim:

1. In a rack for housing a wide range of subrack modules containing circuit units for telecommunications or other electronic equipment of the type wherein the external connectors of the circuit units are connected with rack connections carried by corresponding rack connectors affixable to rack uprights at positions CA and displaceable on the rack uprights between positions CA in increments pCA, and wherein each circuit unit with its external connector is displaceable within the module between subpositions S in subincrements pS, the improvement comprising pitch variator connector means for adapting a position of one of said rack connections to a displacement pS of a corresponding external connector, said pitch variator connector means including a transition piece affixable to the rack upright at available positions CA and a support body for said rack connection adapted for displaceable engagement with said transition piece, said support body being displaceable with respect to said transition piece in subincrements pSCA between subpositions SCA corresponding to subpositions S and being engageable with said transition piece at each of the subpositions SCA, so that said rack connection position is adaptable to displacements pS of the corresponding external connector.

2. The invention of claim 1, wherein said positions CA correspond to a plurality of vertically aligned holes in said uprights, wherein said transition piece comprises a transition plate affixable between adjacent holes, and wherein said support body comprises a rack connector body first section carrying rack connections for at least one of said external connectors, and a second section securable to said first section and frictionally engageable with said transition plate for engagement of said support body in each of the positions SCA.

3. The invention of claim 1, wherein said support body includes said rack connection.

4. The invention of claim 1, wherein said support body is securable to a rack connector body carrying said rack connection.

5. The invention of claim 1, wherein the subincrements pS are equal to the subincrements pSCA.

6. The invention of claim 5, wherein the ratio pCA/pS is a whole number.

7. The invention of claim 3, wherein said rack connection comprises at least one coaxial cable connector for connection with a corresponding external connector, and said transition piece comprises a toothed plate affixable at a position CA on said rack and frictionally engageable with said support body for engaging the support body in each of the positions SCA.

8. The invention of claim 7, wherein the toothed plate comprises a substantially square plate having a single tooth on each side edge, and said support body includes a receiving slot for said plate having corresponding grooved side edges for receiving and engaging the teeth of said plate.

9. The invention of claim 8, wherein the teeth are staggered a distance SF and the number of grooves on each side edge is equal to the ratio pCA/pS.

10. The invention of claim 7, wherein the toothed plate is affixable to said rack at a position CA by a caged nut.

11. The invention of claim 7, wherein the circuit unit is an encased unit.

12. The invention of claim 2, wherein said transition plate includes a plurality of slots at intervals pSCA, and wherein said second section of the support body includes a protruding pin frictionally engageable with each of said slots for engagement of said support body in each of the positions SCA.

13. The invention of claim 12, wherein said transition plate includes two projecting bodies frictionally engageable in adjacent holes of the upright to affix the plate to the upright.

14. The invention of claim 13, wherein (a) said second section of the support body; (b) said transition plate; (c) said upright; (d) said first section of the support body; and (d) said external connector are aligned in that order.

15. The invention of claim 14, wherein said second section is securable to said first section by one or more threaded fasteners.

16. The invention of claim 13, wherein said external connector is associated with a circuit board.

17. The invention of claim 2, wherein said first section is adapted for disposition between said module and said upright.

* * * * *